(12) United States Patent
Lebens et al.

(10) Patent No.: US 9,131,606 B2
(45) Date of Patent: Sep. 8, 2015

(54) MICRO-CHANNEL PATTERN FOR EFFECTIVE INK DISTRIBUTION

(71) Applicants: John Andrew Lebens, Rush, NY (US); Ronald Steven Cok, Rochester, NY (US)

(72) Inventors: John Andrew Lebens, Rush, NY (US); Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 221 days.

(21) Appl. No.: 13/964,453

(22) Filed: Aug. 12, 2013

(65) Prior Publication Data
US 2015/0041203 A1 Feb. 12, 2015

(51) Int. Cl.
*H05K 7/00* (2006.01)
*H05K 1/02* (2006.01)

(52) U.S. Cl.
CPC .................................... *H05K 1/0296* (2013.01)

(58) Field of Classification Search
USPC .......................................... 361/777; 174/261
See application file for complete search history.

(56) References Cited

U.S. PATENT DOCUMENTS

| 8,179,381 | B2 | 5/2012 | Frey et al. |
| 2010/0026664 | A1 | 2/2010 | Geaghan |
| 2011/0007011 | A1 | 1/2011 | Mozdzyn |
| 2011/0099805 | A1* | 5/2011 | Lee .................................. 29/846 |
| 2011/0289771 | A1 | 12/2011 | Kuriki |
| 2011/0291966 | A1* | 12/2011 | Takao et al. ................... 345/173 |
| 2012/0031746 | A1 | 2/2012 | Hwang et al. |
| 2012/0162116 | A1 | 6/2012 | Philipp |

FOREIGN PATENT DOCUMENTS

CN 102063951 7/2013

* cited by examiner

*Primary Examiner* — Andargie M Aychillhum
(74) *Attorney, Agent, or Firm* — Raymond L. Owens

(57) ABSTRACT

A pattern of micro-wires in a layer over which ink is to be coated to form micro-wires includes a substrate with first, second, and third regions. A plurality of connected first micro-channels, second micro-channels, and third micro-channels are formed in the first, second, and third regions having first, second, and third micro-channel densities, respectively. The first density is greater than the second density and the second density is greater than the third density. Thus, the density of the layer monotonically decreases from the first region to the second region and from the second region to the third region so that the ink coated over the layer is more effectively distributed.

20 Claims, 13 Drawing Sheets

MICRO-CHANNEL PATTERN FOR EFFECTIVE INK DISTRIBUTION

CROSS REFERENCE TO RELATED APPLICATIONS

Reference is made to commonly-assigned U.S. patent application Ser. No. 13/751,340 filed Jan. 28, 2013, entitled "Large-Current Micro-Wire Pattern" by Lebens et al and to commonly-assigned U.S. patent application Ser. No. 13/571,704 filed Aug. 10, 2012, entitled "Micro-Wire Electrode Pattern" by Ronald S. Cok, the disclosures of which are incorporated herein.

FIELD OF THE INVENTION

The present invention relates to patterns of micro-channels imprinted in a layer for forming micro-wire electrical conductors.

BACKGROUND OF THE INVENTION

Transparent conductors are widely used in the flat-panel display industry to form electrodes for electrically switching the light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Touch screens with transparent electrodes are widely used with electronic displays, especially for mobile electronic devices. Such devices typically include a touch screen mounted over an electronic display that displays interactive information. Touch screens mounted over a display device are largely transparent so a user can view displayed information through the touch-screen and readily locate a point on the touch-screen to touch and thereby indicate the information relevant to the touch. By physically touching, or nearly touching, the touch screen in a location associated with particular information, a user can indicate an interest, selection, or desired manipulation of the associated particular information. The touch screen detects the touch and then electronically interacts with a processor to indicate the touch and touch location. The processor can then associate the touch and touch location with displayed information to execute a programmed task associated with the information. For example, graphic elements in a computer-driven graphic user interface are selected or manipulated with a touch screen mounted on a display that displays the graphic user interface.

Referring to FIG. 9, a prior-art display and touch-screen system 100 includes a display 110 having a display area 111. A corresponding touch screen 120 is mounted with display 110 so that information displayed on display 110 in display area 111 can be viewed through touch screen 120. Graphic elements displayed on the display 110 in display area 111 are selected, indicated, or manipulated by touching a corresponding location on touch screen 120. Touch screen 120 includes a first transparent substrate 122 with first transparent electrodes 130 formed in the x dimension on first transparent substrate 122 and a second transparent substrate 126 with second transparent electrodes 132 formed in the y-dimension facing the x-dimension first transparent electrodes 130 on second transparent substrate 126. A dielectric layer 124 is located between first and second transparent substrates 122, 126 and first and second transparent electrodes 130, 132. Referring also to the plan view of FIG. 10, in this example first pad areas 128 in first transparent electrodes 130 are located adjacent to second pad areas 129 in second transparent electrodes 132 in display area 111. (First and second pad areas 128, 129 are separated into different parallel planes by dielectric layer 124.) First and second transparent electrodes 130, 132 have a variable width and extend in orthogonal directions (for example as shown in U.S. Patent Application Publication Nos. 2011/0289771 and 2011/0099805). When a voltage is applied across first and second transparent electrodes 130, 132, electric fields are formed between first pad areas 128 of x-dimension first transparent electrodes 130 and second pad areas 129 of y-dimension second transparent electrodes 132.

A display controller 142 (FIG. 9) connected through electrical buss connections 136 controls display 110 in cooperation with a touch-screen controller 140. Touch-screen controller 140 is connected through electrical buss connections 136 and wires 134 outside display area 111 and controls touch screen 120. Touch-screen controller 140 detects touches on touch screen 120 by sequentially electrically energizing and testing x-dimension first and y-dimension second transparent electrodes 130, 132.

Referring to FIG. 11, in another prior-art embodiment, rectangular first and second transparent electrodes 130, 132 are arranged orthogonally in display area 111 projected from display 110 onto first and second transparent substrates 122, 126 with intervening dielectric layer 124, forming touch screen 120 which, in combination with display 110 forms touch screen and display system 100. First and second pad areas 128, 129 are formed where first and second transparent electrodes 130, 132 overlap. Touch screen 120 and display 110 are controlled by touch screen and display controllers 140, 142, respectively, through electrical busses 136 and wires 134 outside display area 111.

The electrical busses 136 and wires 134 are electrically connected to first or second transparent electrodes 130, 132 but are located outside display area 111. However, at least a portion of electrical busses 136 or wires 134 are formed on touch screen 120 to provide the electrical connection to first or second transparent electrode 130, 132. It is desirable to maximize the size of display area 111 with respect to the entire display 110 and touch screen 120. Thus, it can be helpful to reduce the size of wires 134 and electrical busses 136 in touch screen 120 outside display area 111. At the same time, to provide excellent electrical performance, wires 134 and electrical busses 136 need a low resistance. Furthermore, to reduce manufacturing costs, it is desirable to reduce the number of manufacturing steps and materials in touch screen 120.

Touch-screens including very fine patterns of conductive elements, such as metal wires or conductive traces are known. For example, U.S. Patent Application Publication No. 2010/0026664 teaches a capacitive touch screen with a mesh electrode, as does U.S. Pat. No. 8,179,381. Referring to FIG. 12, a prior-art x- or y-dimension first or second variable-width apparently transparent electrode 130, 132 includes a micro-pattern 156 of micro-wires 150 arranged in a rectangular grid. The micro-wires 150 are multiple very thin metal conductive traces or wires formed on the first and second transparent substrates 122, 126 (not shown in FIG. 12) to form the x- or y-dimension first or second transparent electrodes 130, 132. The micro-wires 150 are so narrow that they are not readily visible to a human observer, for example 1 to 10 microns wide. The micro-wires 150 are typically opaque and spaced apart, for example by 50 to 500 microns, so that the first or second transparent electrodes 130, 132 appear to be transparent and the micro-wires 150 are not distinguished by an observer.

U.S. Patent Application Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counterclockwise directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 13, this prior-art design includes micro-wires 150 arranged in the micro-pattern 156 with the micro-wires 150 oriented at an angle to the direction of horizontal first transparent electrodes 130 in a first layer (e.g. first transparent substrate 122 in FIG. 11) and vertical second transparent electrodes 132 in a second layer (e.g. second transparent substrate 126 in FIG. 11).

A variety of layout patterns are known for micro-wires used in transparent electrodes. U.S. Patent Application Publication No. 2012/0031746 discloses a number of micro-wire electrode patterns, including regular and irregular arrangements. The conductive pattern of micro-wires in a touch screen can be formed by closed figures distributed continuously in an area of 30% or more, preferably 70% or more, and more preferably 90% or more of an overall area of the substrate and can have a shape where a ratio of standard deviation for an average value of areas of the closed figures (a ratio of area distribution) can be 2% or more. As a result, a Moiré phenomenon can be prevented and excellent electric conductivity and optical properties can be satisfied. U.S. Patent Application Publication No. 2012/0162116 discloses a variety of micro-wire patterns configured to reduce or eliminate interference patterns. As illustrated in FIG. 14, U.S. Patent Application Publication No. 2011/0007011 teaches a first or second transparent micro-wire electrode 130, 132 having micro-wires 150 arranged in a micro-wire pattern 156.

It is important that micro-wires 150 used in micro-patterns 156 suitable for apparently transparent electrodes 130, 132 have a low resistivity. Such a low resistivity enables micro-wire micro-patterns 156 with increased transparency and improves electrical conduction for electrical busses 136 connected to the apparently transparent electrodes 130, 132. In order to make low-resistivity micro-wires 150 having desired micro-patterns 156, robust manufacturing processes are necessary. There is a need, therefore, for improved electrically conductive micro-patterns compatible with micro-wire electrodes that provide improved conductivity and are suitable for robust manufacturing processes.

SUMMARY OF THE INVENTION

In accordance with the present invention, a pattern of micro-channels in a layer over which ink is to be coated to form micro-wires comprises:

a substrate having the layer formed thereon, the layer including first, second, and third regions, wherein the first region is adjacent to the second region, the second region is adjacent to the third region, and the second region is between and separates the first and third regions;

a plurality of connected first micro-channels formed in the first region of the layer, wherein the first region has a first density of the first micro-channels;

a plurality of connected second micro-channels formed in the second region of the layer, wherein the second region has a second density of the second micro-channels;

a plurality of connected third micro-channels formed in the third region of the layer, wherein the third region has a third density of the third micro-channels;

wherein the first density is greater than the second density, the second density is greater than the third density; and whereby the density of the layer monotonically decreases from the first region to the second region and from the second region to the third region so that the ink coated over the layer is more effectively distributed.

According to embodiments of the present invention, electrically conductive micro-patterns compatible with micro-wire electrodes provide improved conductivity and are suitable for efficient high-quality manufacturing processes.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein.

Figure 1:
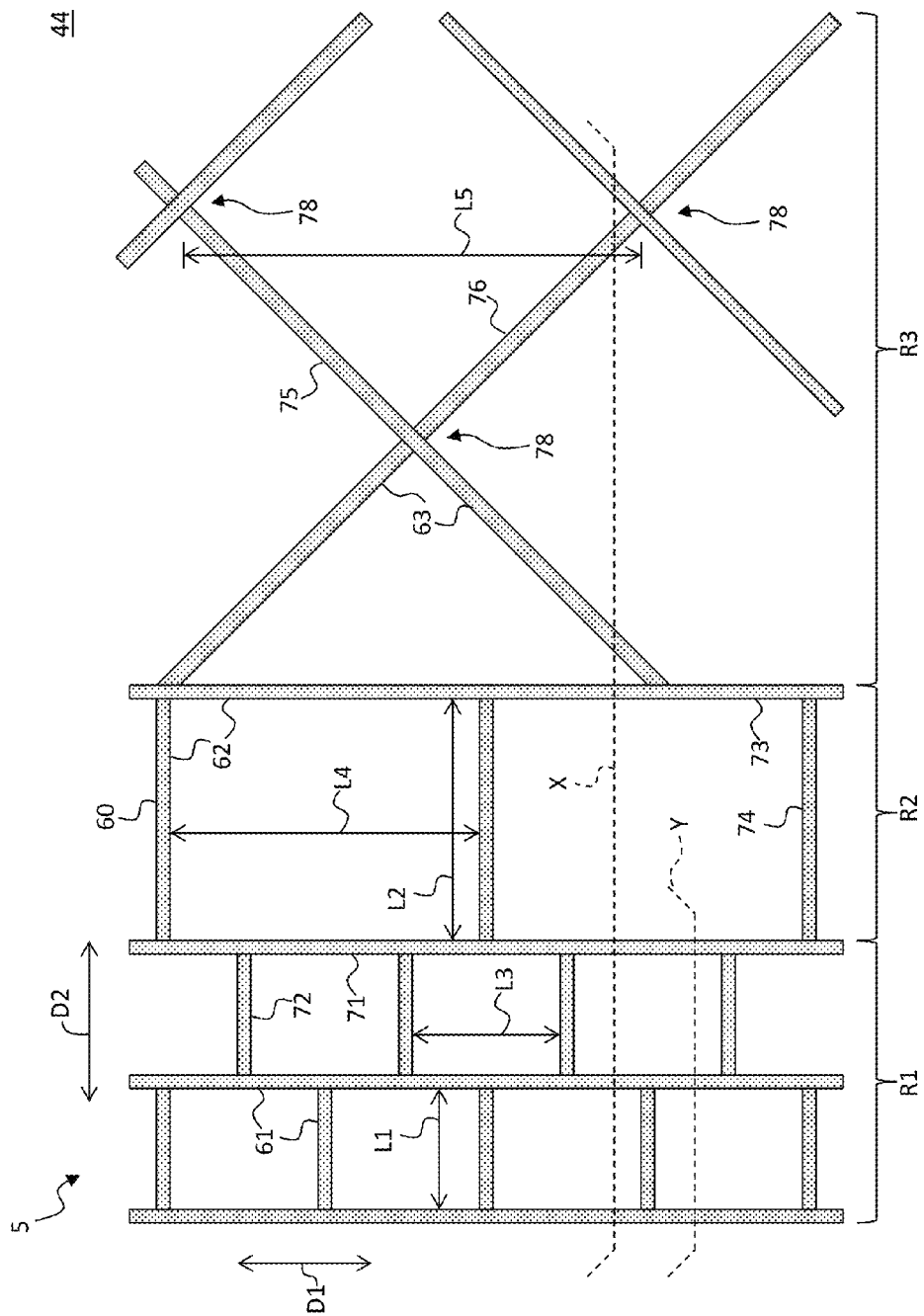
FIG. 1 is a plan view of an embodiment of the present invention.

The Figures are not necessarily to scale, since the range of dimensions in the drawings is too great to permit depiction to scale.

DETAILED DESCRIPTION OF THE INVENTION

The present invention is directed toward a pattern of micro-channels for micro-wires forming an electrical conductor on or in a substrate. The pattern enables robust manufacturing yielding high-quality, electrically conductive micro-wires, especially when made using an embossing or imprinting method. Referring to FIG. 1 in a plan view and to FIGS. 2 and 3 in cross section taken over line X of FIG. 1, a micro-channel pattern 5 of micro-channels 60 is formed in a layer 42 formed on a substrate 40 (FIG. 2) over which ink is to be coated to form micro-wires 50 (FIG. 3). The layer 42 has a surface 44 including first, second, and third regions R1, R2, and R3. The first region R1 is adjacent to the second region R2 and the second region R2 is adjacent to the third region R3. The second region R2 is between and separates the first and third regions R1 and R3.

A plurality of connected first micro-channels 61 is formed in the first region R1 of the layer 42. The first region R1 has a first density of the first micro-channels 61. A plurality of connected second micro-channels 62 are formed in the second region R2 of the layer 42. The second region R2 has a second density of the second micro-channels 62. A plurality of connected third micro-channels 63 are formed in the third region R3 of the layer 42. The third region R3 has a third density of the third micro-channels 63.

The first density is greater than the second density and the second density is greater than the third density. Thus, the density of the layer 42 monotonically decreases from the first region to the second region and from the second region to the third region so that the ink coated over the layer 42 is more effectively distributed.

Figure 8:
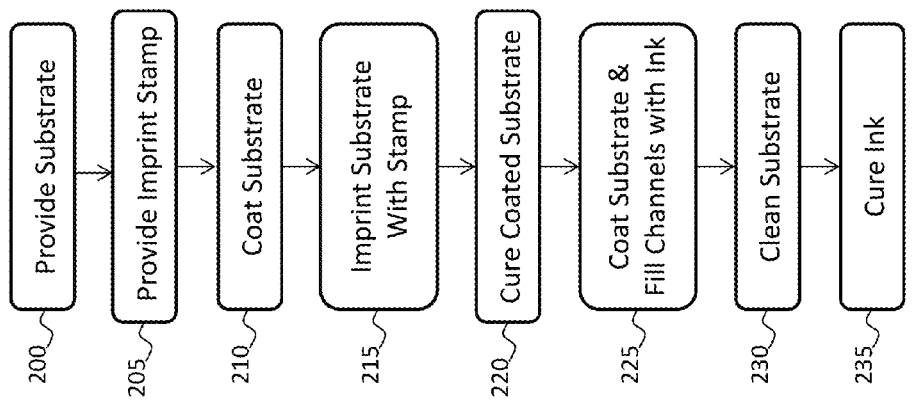
FIG. 8 is a flow-graph illustrating various methods of making the present invention.
Figure 9:
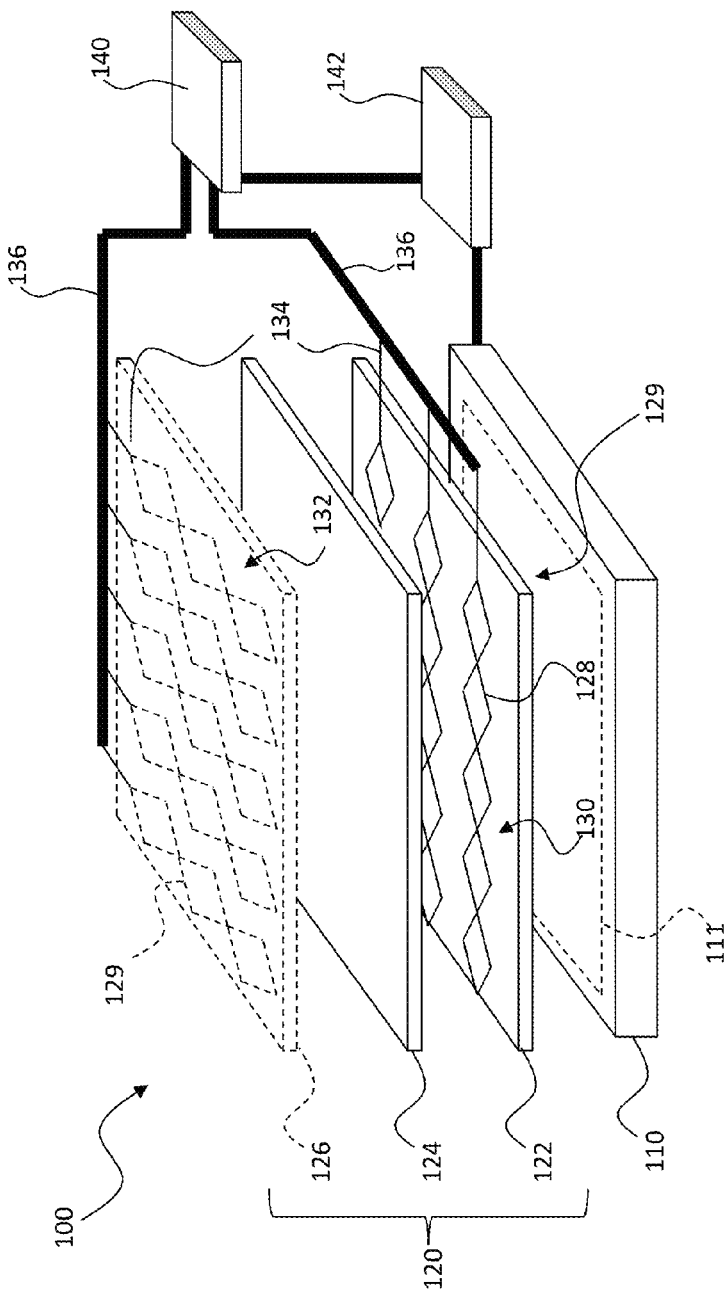
FIG. 9 is an exploded perspective illustrating a prior-art mutual capacitive touch screen having adjacent pad areas in conjunction with a display and controllers.
Figure 10:
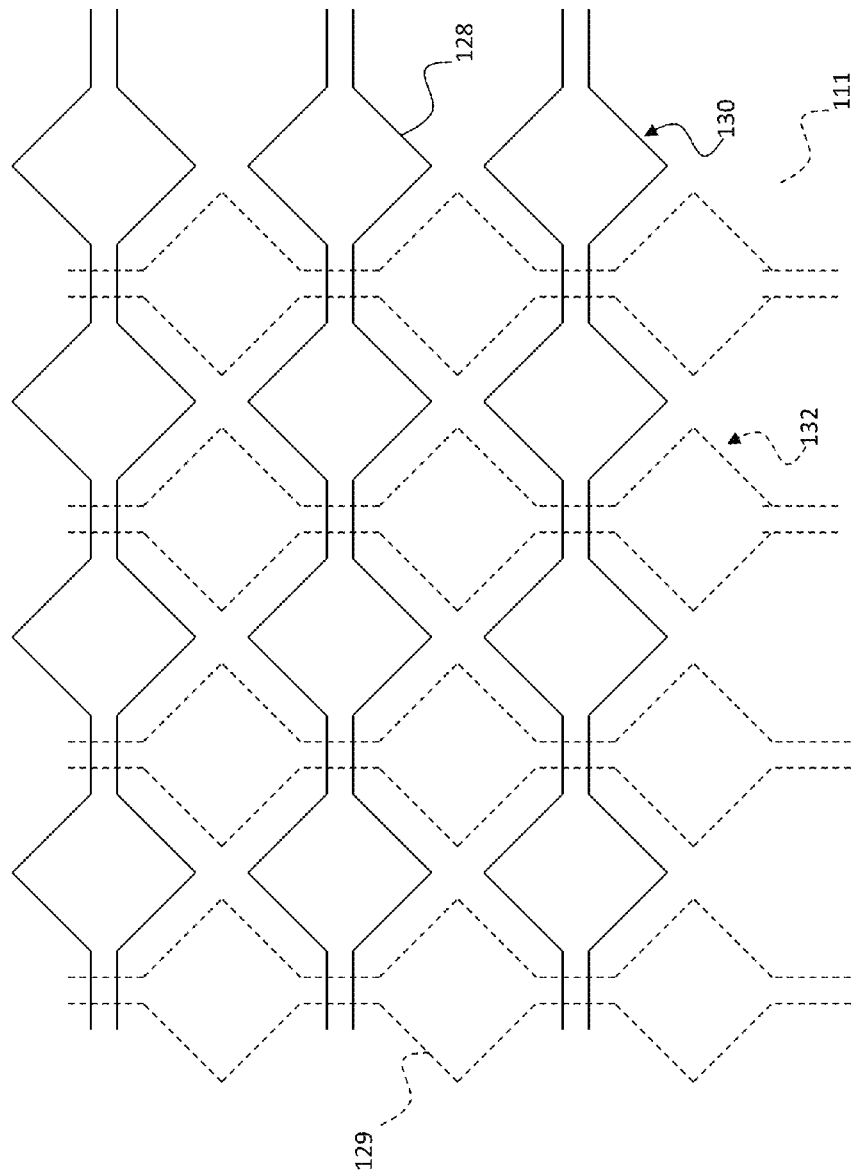
FIG. 10 is a schematic illustrating prior-art pad areas in a capacitive touch screen.
Figure 11:
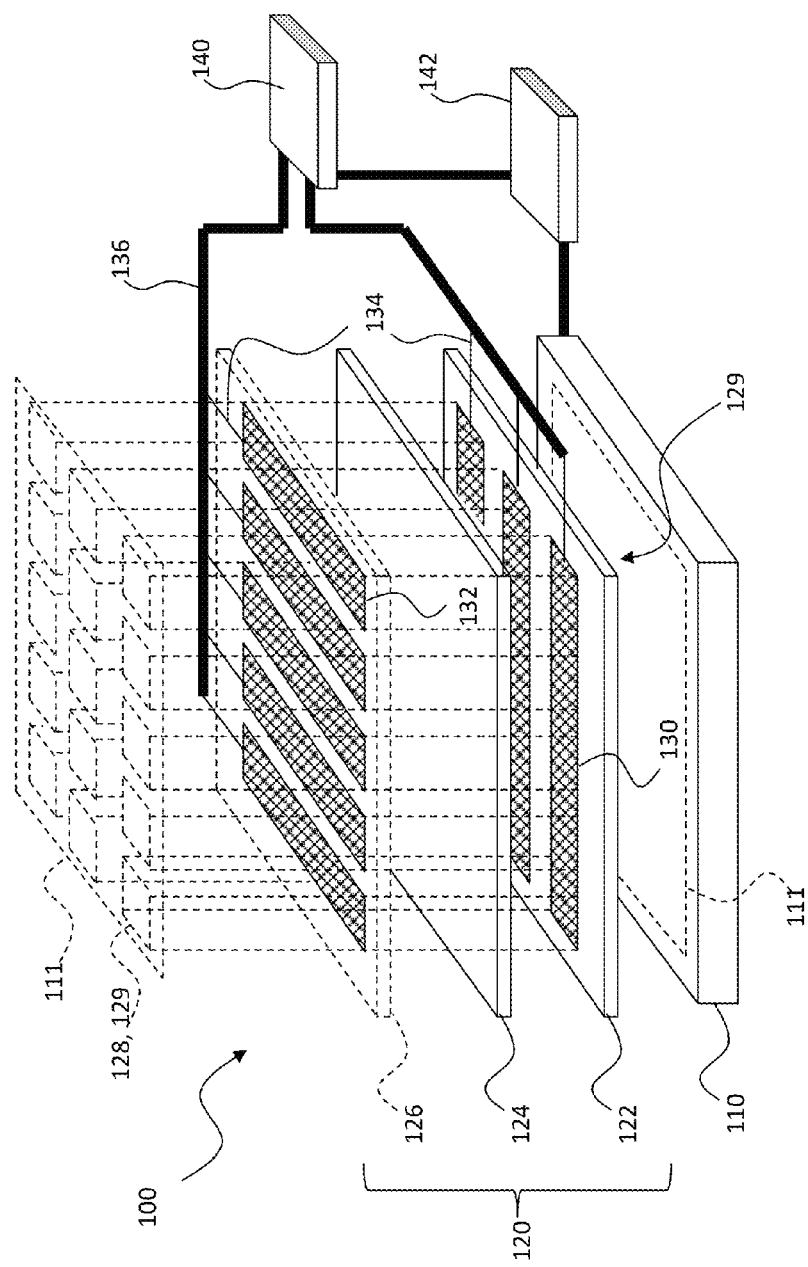
FIG. 11 is an exploded perspective illustrating a prior-art mutual capacitive touch screen having overlapping pad areas in conjunction with a display and controllers.
Figure 12:
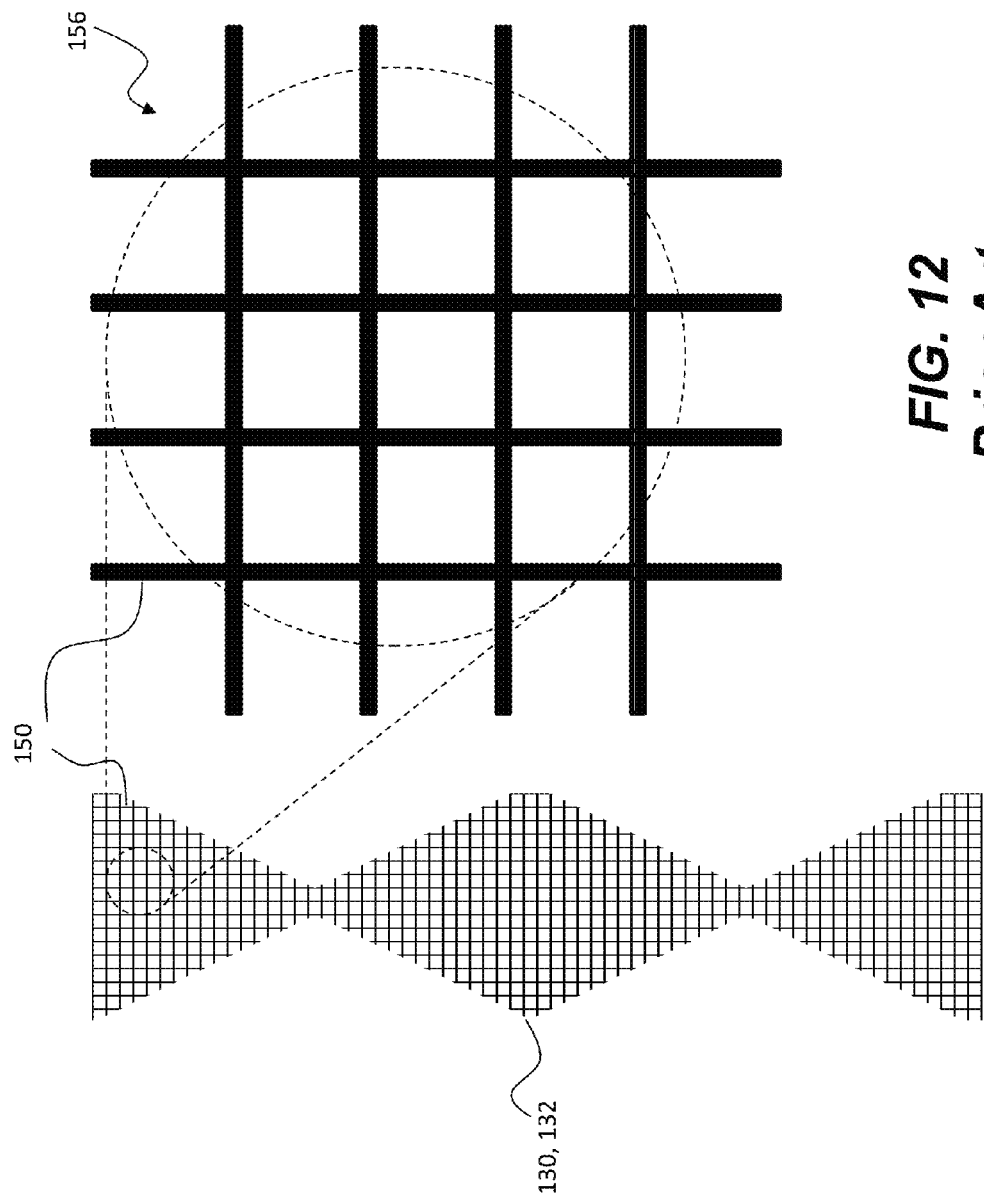
FIG. 12 is a schematic illustrating prior-art micro-wires in an apparently transparent electrode.
Figure 13:
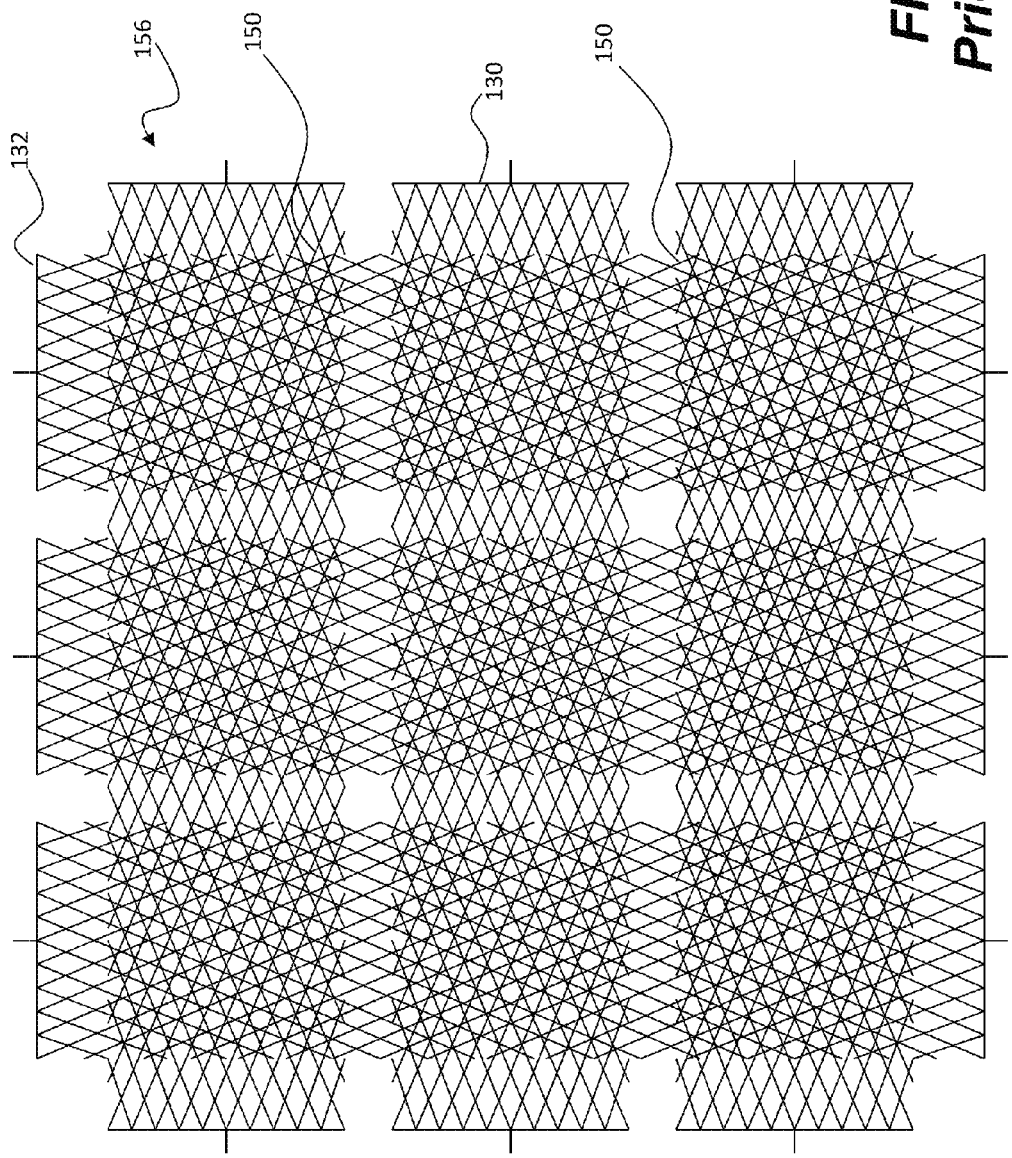
FIG. 13 is a schematic illustrating prior-art transparent micro-wire electrodes arranged in two arrays of orthogonal transparent electrodes.
Figure 14:
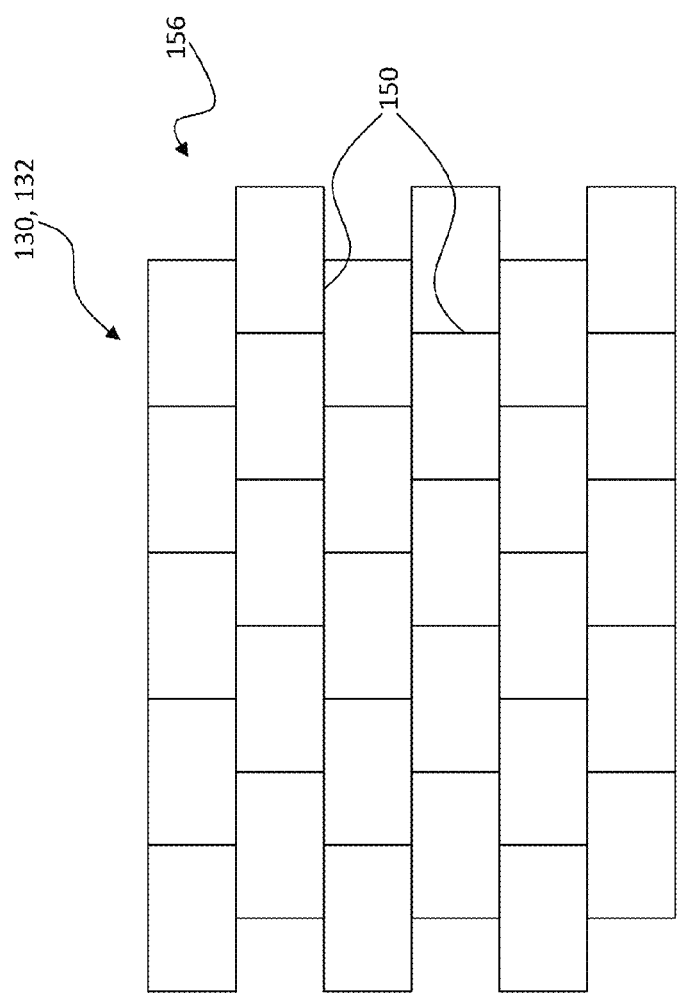
FIG. 14 is a schematic illustrating a prior-art transparent micro-wire electrode.

Referring to FIG. 3, in a further embodiment of the present invention, cured conductive ink in the first, second, and third micro-channels 61, 62, 63 form first, second, and third micro-wires 51, 52, 53 respectively in the layer 42 on the substrate 40. Referring also to FIG. 8, in a method useful for making the micro-channel pattern 5 of micro-wires 50 forming an electrical conductor on or in the substrate 40, the substrate 40 is provided in step 200 and an imprint stamp is provided in step 205. The substrate 40 is coated in step 210 to form the layer 42, for example with a polymer. The polymer coating is imprinted in step 215 with the print stamp to form micro-channels 60 and cured in step 220. The layer 42 and micro-channels 60 are coated in step 225 with a conductive ink, cleaned in step 230, and the remaining ink in micro-channels 60 is cured in step 235 to form micro-wires 50. Thus, the layer 42 is a cured layer with imprinted micro-channels 60 filled with cured conductive ink forming micro-wires 50 in the imprinted micro-channels 60. Imprinting is also known as embossing.

Figure 2:
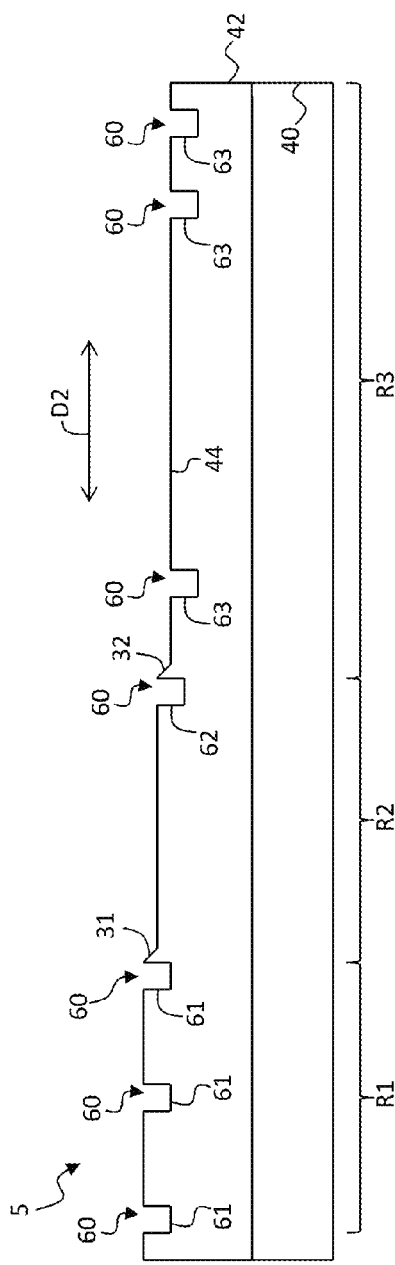
FIGS. 2 and 3 are cross sections of embodiments of the present invention corresponding to FIG. 1.
Figure 3:
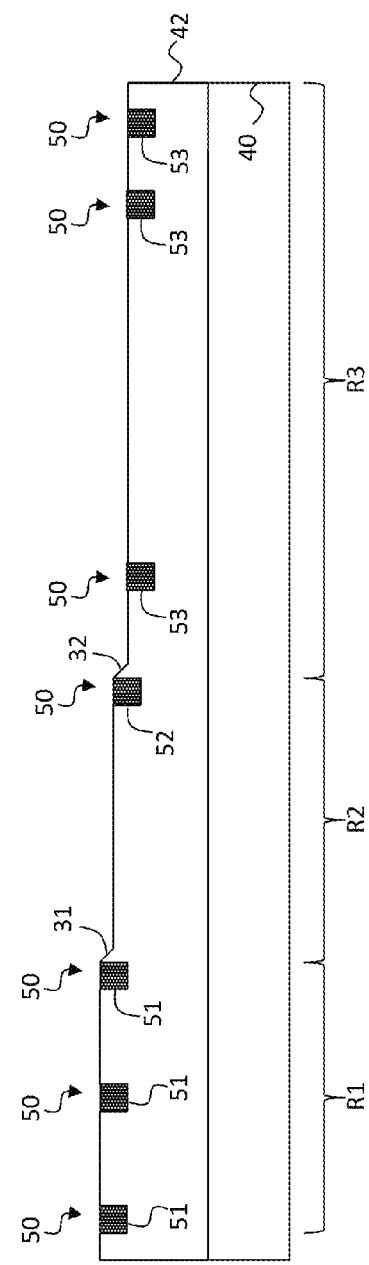

Referring further to FIGS. 2, 3 and 8, it has been determined experimentally that, when micro-channels 60 are imprinted in the layer 42 by the stamp, the volume occupied by the micro-channels 60 causes the surface 44 of the layer 42 to rise, making the layer 42 slightly thicker in the area where the micro-channels 60 are formed. The change in layer thickness is dependent upon the density of the micro-channels 60 in each region. As illustrated in the Figures, the density of micro-channels 61 in the region R1 is greater than that of micro-channels 62 in the region R2. Thus, the layer 42 in the region R1 is slightly thicker than the layer 42 in the region R2. This is illustrated with slope 31 of layer surface 44 of the layer 42 where the region R1 meets the region R2 of the layer 42. Similarly, the density of micro-channels 62 in the region R2 is greater than that of micro-channels 63 in the region R3. Thus, the layer 42 in the region R2 is slightly thicker than the layer 42 in the region R3. This is illustrated with slope 32 of layer surface 44 of the layer 42 where the region R2 meets the region R3 of the layer 42.

The change in the layer 42 thickness illustrated with the slopes 31 and 32 where the regions meet causes conductive ink coated over the layer 42 in step 225 to be unevenly distributed. This uneven ink distribution can result in improper micro-channel 60 filling, leading to poor micro-wire formation, poor electrical conductivity of micro-wires 50, and poor operational performance.

This problem, not recognized in the prior art, is especially problematic where the micro-channel density changes by a large amount in a small area of the layer 42. Thus, according to various embodiments of the present invention, large changes in layer 42 thickness are ameliorated by more gradually changing the micro-channel 60 density in an imprinted micro-channel pattern. As illustrated in FIGS. 1, 2, and 3, a micro-channel pattern 5 having an intermediate density is formed in the region R2 between the regions R1 and R3, where the micro-channel density of region R2 is less than that of region R1 and greater than that of region R3. Therefore, by forming region R2 between regions R1 and R3, the layer 42 thickness from region R1 having a high spatial micro-channel density to region R3 having a low spatial micro-channel density is more gradually reduced, enabling more even conductive ink distribution and consequently better micro-wire formation, electrical conductivity, and operational performance.

Figure 4:
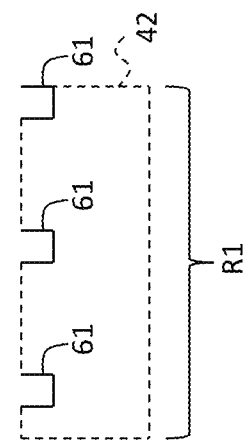
FIG. 4 is a cross section of a region useful in understanding the present invention corresponding to FIG. 1.

Micro-channel density refers to the number, width, depth, or length of micro-channels 60 in a region. In one embodiment, each of the first, second, and third densities is a measure of the volume occupied by the first, second, and third micro-channels 61, 62, 63 compared to the area of the corresponding first, second, and third regions R1, R2, R3 in which the first, second, and third micro-channels 61, 62, 63 are located. FIG. 4 illustrates in cross section Y three micro-channels 61 in region R1 formed in layer 42 corresponding to FIG. 1. Each micro-channel 60 has a unit width and depth. As shown in the illustration of FIG. 1, region R1 has an area of (53×21) units or 1113 units and a micro-channel volume of ((53×3)+(9×9))=240. As shown in FIG. 1, the micro-channel depth is the same as the micro-channel width: one unit. Therefore, a density of region R1 is 240/1113 or 21.56%. Region 2 has an area of (53×19) units or 1007 units and a micro-channel volume of (53+(19×3))=110. Therefore, a comparable density of region 2 is 110/1007 or 10.9%. Region 3 has an area of (53×50) units or 2650 units and a micro-channel volume of 198. Therefore, a comparable density of region R3 is 198/2650 or 7.5%. Thus, the density of region R1 is greater than the density of region R2, which is in turn greater than the density of region R3 and therefore the density of the layer 42 monotonically decreases from the first region R1 to the second region R2 and from the second region R2 to the third region R3. The rate at which layer 42 thickness changes from region R1 to R3 is decreased by the presence of region R2 and therefore the distribution of ink coated over the layer 42 is more effective.

Other specifications of density that reduces the rate of layer 42 thickness change are contemplated herein and are included in the present invention. In another embodiment, the ratio of micro-channel volume and region volume specify the region density. In a further embodiment of the present invention, when the layer 42 is coated (step 210) over the regions R1, R2, and R3 before imprinting (step 215), layer 42 has the same thickness in the regions R1, R2, and R3.

In another embodiment, each of the first, second, and third densities is a measure of the area occupied by the first, second, and third micro-channels 61, 62, 63 compared to the area of the corresponding first, second, and third regions in which the first, second, and third micro-channels 61, 62, 63 are located. For example, in the illustration of FIGS. 1 and 2, the micro-channel depth is one unit, as is the width, so the values calculated for volume are the same values as for the micro-channel area, albeit with different units.

Different micro-channel patterns 5 are formed in the regions corresponding to different embodiments of the present invention. Referring again to FIG. 1, in one embodiment the first micro-channels 61 include one or more first-direction first micro-channels 71 connected to one or more second-direction first micro-channels 72. The first-direction first micro-channels 71 extend in a first micro-channel direction D1 and the second-direction first micro-channels 72 extend in a second micro-channel direction D2 different from the first micro-channel direction D1. In another embodiment, the second micro-channels 62 include one or more first-direction second micro-channels 73 connected to one or more second-direction second micro-channels 74, the first-direction second micro-channels 73 extending in the first micro-channel direction D1 and the second-direction second micro-channels 74 extending in the second direction D2.

In yet another embodiment, the first-direction first micro-channels 71 are spaced apart by a first distance L1, the first-direction second micro-channels 73 are spaced apart by a second distance L2, and the second distance L2 is greater than the first distance L1.

Since the spatial density of micro-wires 60 within a region affects the conductivity of the micro-wire pattern for that region, a reduced spatial density will also reduce the conductivity of the micro-wires 50 in that region. This reduction in conductivity can be moderated to some extent by using micro-wires having a greater width or depth in one region as compared to another. For example, region R2 can have micro-channels 60 with a greater width or depth than micro-channels 60 in region R1, with micro-wires 50 of corresponding size in each region.

Figure 5:
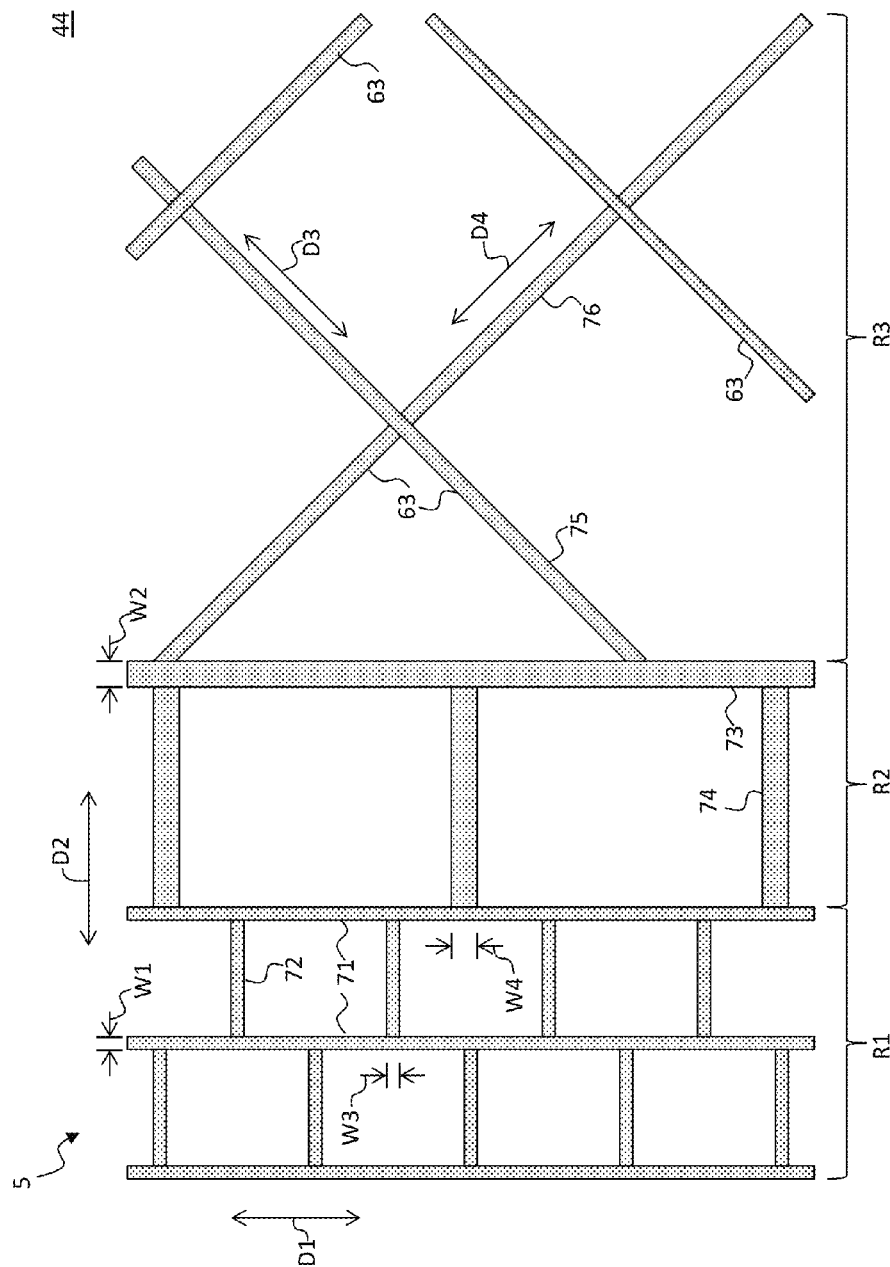
FIG. 5 is a plan view of another embodiment of the present invention.

Therefore, in a further embodiment illustrated in FIG. 5, the first-direction first micro-channels 71 have a first width W1, the first-direction second micro-channels 73 have a second width W2, and the second width W2 is greater than the first width W1. Alternatively, or in addition, second-direction first micro-channels 72 have a first width W3, the second-direction second micro-channels 74 have a second width W4, and the second width W4 is greater than the first width W3.

Referring further to FIGS. 1 and 5, in another embodiment, the third micro-channels 63 include one or more first-direction third micro-channels 75 connected to one or more second-direction third micro-channels 76. The first-direction third micro-channels 75 extend in a third micro-channel direction D3 different from the first micro-channel direction D1 and the second-direction third micro-channels 76 extend in a fourth micro-channel direction D4 different from the second micro-channel direction D2. Furthermore, the fourth micro-channel direction D4 is different from the third micro-channel direction D3.

Since the third micro-channels in region R3 have a density less than that of the first and second micro-channels 61, 62 in regions R1 and R2, the third micro-channels 63 can include one or more first-direction third micro-channels 75 connected to and intersecting with one or more second-direction third micro-channels 76 to form micro-channel intersections 78 spaced apart by an intersection distance L5 (FIG. 1) that is greater than a third distance L3 between the second-direction first micro-channels 72 of the first region R1 or that is greater than a fourth distance L4 between the second-direction second micro-channels 74 of the second region R2.

Figure 6:
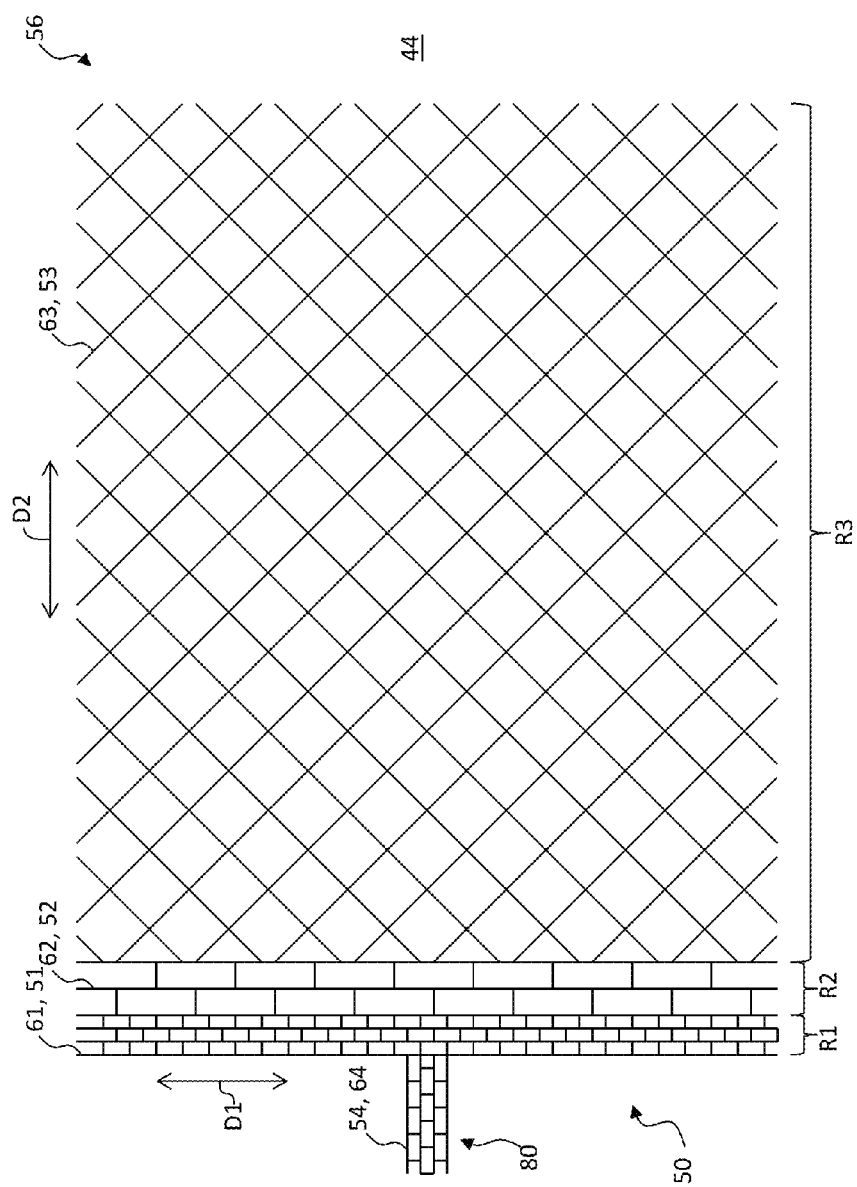
FIG. 6 is a plan view of an alternative embodiment of the present invention.

Referring to FIG. 6, the present invention is useful for conducting signals to and from an apparently transparent electrode 56, for example as formed by third micro-wires 53 in third micro-channels 63. The apparently transparent electrode 56 extends lengthwise across the substrate 40 in a direction D2, as illustrated in FIG. 6. In order to effectively conduct signals to the apparently transparent electrode 56, a conductive network of micro-wires 50 is electrically connected to the apparently transparent electrode 56 across the width of the apparently transparent electrode 56 at one end of the apparently transparent electrode 56. The first and second micro-wires 51 and 52, formed in first and second micro-channels 61 and 62, improve electrical signal conduction to and from a buss 80 made of fourth micro-wires 54 likewise formed in fourth micro-channels 64. Since the buss 80 conducts all of the electrical signals provided to or received from the apparently transparent electrode 56 and typically has a smaller area than the apparently transparent electrode 56, it also has a higher density than the apparently transparent electrode 56. Moreover, because the buss 80 conducts a higher current density (measured in electrical current per area) than the first and second micro-wires 51, 52 of the first and second micro-channels 61, 62 when connected at or near the center of the width of the apparently transparent electrode 56, it also has a density that is equal to or greater than the density of first and second micro-channels 61, 62 in regions R1 and R2. In other embodiments (not shown) buss 80 is electrically connected to the apparently transparent electrode 56 at other locations, for example at a corner of the apparently transparent electrode 56 or along the width but not near the center. If the buss 80 has the same density as region R1 and is electrically connected to the apparently transparent electrode 56 at a corner of the apparently transparent electrode 56, it can have a current density substantially equivalent to the current density of the micro-wires 51 in micro-channels 61 at the corner.

Therefore, according to another embodiment of the present invention, a pattern of interconnected fourth micro-channels 64 extends in a fourth direction D4 different from the first direction D1. The pattern of interconnected fourth micro-channels 64 has a fourth density of the fourth micro-channels 64 equal to or greater than the first density. The fourth direction D4 can be any direction over the substrate 40, but is typically different from the first direction D1 so as to connect the apparently transparent electrode 56 to a connector, for example a ribbon cable for connecting to an integrated circuit controller (not shown in FIG. 6).

It is generally the case that third micro-wires 53 are not oriented in the same direction as fourth micro-wires 54, since the fourth micro-wires 54 are typically used to conduct electrical signals to a connecting cable since the buss 80 can extend in a direction different from the apparently transparent electrode 56 or the third micro-wires 53. Thus, in useful embodiments of the present invention, the first region R1 extends across the substrate 40 in a first region direction, the second region R2 extends across the substrate in a second region direction, and the third region R3 extends across the substrate 40 in a third region direction. The first region direction and second region direction are substantially parallel and the first region direction and the third region direction are not parallel. In the example of FIG. 6, the first region direction extends in the direction D1, the second region direction also extends in the direction D1, and the third region direction extends in the direction D2. By extending in a direction is meant the direction of the longest micro-channels in the region. Alternatively, the micro-channels 60 in a region can be considered as a micro-wire network in an area having an aspect ratio other than one. The larger dimension of the area is the direction in which the region extends. Alternatively, the direction in which a region extends is typically the direction of the greatest spatial extent of the micro-wire channels 60 over the substrate 40 on which the micro-channel pattern 5 is formed. In a further embodiment, the first region direction and the third region direction are substantially orthogonal, as shown in FIG. 6.

In an embodiment of the present invention and as shown in FIG. 6, the first region R1 has a side with a first width in direction D2 and a side with a first length in direction D1 greater than the first width, the second region R2 has a side with a second width in direction D2 and a side with a second length in direction D1 greater than the second width, the third region R3 has a side with a third width in direction D1 and a side with a third length in direction D2 greater than the third width. The third length is greater than the second length, the second region R2 side having the second length extends along the third region R3 side having the third width, and the first region R1 side having the first length extends along at least the second region R2 side having the second length. Thus electrical signals on the micro-wires 53 are efficiently distributed by the micro-wires 52 and conducted with a lower resistance by the micro-wires 51. In a further embodiment, the second width is greater than the first width.

In other embodiments, the first micro-channel direction D1 is substantially parallel to the first region R1 direction or the first direction D1 is substantially parallel to the second region R2 direction or the first direction D1 is substantially orthogonal to the third region R3 direction.

The present invention provides the improved micro-channel pattern 5 with micro-channels 60 that are more easily filled with conductive ink, thereby forming better micro-wires 50 having better conductivity and operational performance. Furthermore, the micro-channel pattern 5 can reduce electrical resistance in connecting an apparently transparent electrode 56 to the buss 80 for electrical connection to a controller.

In operation, apparently transparent micro-wire electrodes 56 are electrically connected to a controller, for example an integrated circuit processor (not shown). In some embodiments, the integrated circuit processor is adhered to the same substrate 40; in others a connector from the substrate 40 to the integrated circuit processor is needed. Integrated circuit processors useful for controlling apparently transparent micro-wire electrodes 56 are known in the art and can be used with the present invention by providing electrical signals to the apparently transparent micro-wire electrodes 56 or by measuring electrical signals from the apparently transparent micro-wire electrodes 56.

The electrically conductive micro-channel patterns 5 of the present invention can be used to make electrical conductors and busses for electrically connecting the apparently transparent micro-wire electrodes 56 to electrical connectors or controllers such as integrated circuit controllers. One or more electrically conductive micro-wire patterns 5 can be used in a single substrate 40 and can be used, for example in touch screens that use the apparently transparent micro-wire electrodes 56. The electrically conductive micro-channel patterns 5 can be located in areas other than display areas, for example in the perimeter of the display area of a touch screen, where the display area is the area through which a user views a display.

The substrate 40 or layer 42 can be a rigid or a flexible substrate made of, for example, a glass or polymer material, can be transparent, and can have opposing substantially parallel and extensive surfaces. The substrates 40 or layers 42 can include a dielectric material useful for capacitive touch screens and can have a wide variety of thicknesses, for example 6 microns, 10 microns, 50 microns, 100 microns, 1 mm, or more. In various embodiments of the present invention, the substrates 40 are provided as a separate structure or the layer 42 is coated on another underlying substrate, for example by coating a polymer layer on an underlying glass substrate. Such substrates 40 and the layers 42 and their methods of construction are known in the prior art. The substrate 40 can be an element of other devices, for example the cover or substrate of a display or a substrate or dielectric layer of a touch screen.

First, second, and third micro-channels 61, 62, 63 can be formed in a common process step and with common materials. Alternatively, different process steps and different materials can be used. First, second, and third micro-channels 61, 62, 63 can be identical in cross section. Third micro-wires 53 formed in third micro-channels 63 can form a transparent electrode while first and second micro-wires 51, 52 formed in first and second micro-channels 61, 62 can have a higher electrical conductivity, since they are located more densely over substrate 40.

In various embodiments, the regions R1 or R2 have a transparency of less than 75% and greater than 0%. The transparency of the regions R1 or R2 is the percent of the substrate area over which micro-wires 50 extend that is not covered by micro-wires 50. Electrically conductive micro-wire patterns 5 of the present invention can have a direction of greater or preferred conductance.

In other embodiments, one or more micro-channels 60 has a width of greater than or equal to 0.5 µm and less than or equal to 20 µm to provide an apparently transparent micro-wire electrode 56.

Figure 7:
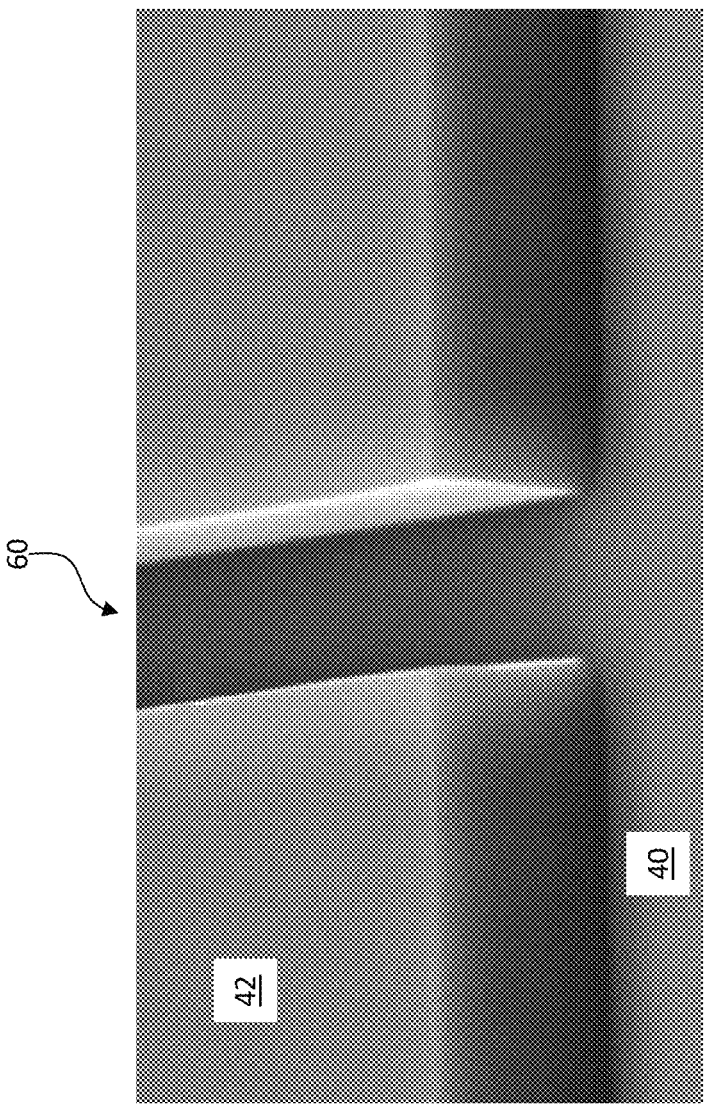
FIG. 7 is a micro-graph of a micro-channel formed in a layer useful in understanding the present invention.

The cross section of micro-channel 60 can substantially form a rectangle, as shown in FIG. 7. FIG. 7 is a micro-graph showing the substrate 40 with the layer 42 formed thereon and a micro-channel 60 having a rectangular cross section imprinted in the layer 42. Alternatively, the cross section of micro-channel 60 can substantially form a trapezoid, whose base is closer to layer surface 44 of the layer 42 than the side of the trapezoid opposite the base (the trapezoid top).

A variety of methods can be used to make micro-wires 50 of electrically conductive micro-channel pattern 5. Some of these methods are known in the prior art, for example as taught in CN102063951 and above-cited commonly-assigned U.S. patent application Ser. No. 13/571,704, which are hereby incorporated by reference in their entirety. As discussed in CN102063951, a pattern of micro-channels 60 can be formed in the substrate 40 having the layer 42 using an embossing or imprinting technique. Embossing or imprinting methods are generally known in the prior art and typically include coating a curable liquid, such as a polymer, onto a rigid substrate to form the layer 42. The polymer is partially cured (e.g. through heat or exposure to light or ultraviolet radiation) and then a pattern of micro-channels 60 is embossed (impressed) onto the partially cured polymer layer 42 by a master having a reverse pattern of ridges formed on its surface. The polymer is then completely cured. A conductive ink is coated over the layer 42 and into micro-channels 60. The excess conductive ink between micro-channels 60 is removed, for example by using a squeegee, mechanical buffing, patterned chemical electrolysis, or patterned chemical corrosion. The conductive ink in the micro-channels 60 is cured, for example by heating.

The conductive inks can include nano-particles, for example silver, in a carrier fluid such as an aqueous solution. The carrier fluid can include surfactants that reduce flocculation of the metal particles. Typical weight concentrations of the silver nano-particles range from 30% to 90%. Because of its high density, the volume concentration of silver in the solution is much lower, typically 4-50%. Once deposited, the conductive inks are cured, for example by heating. After filling micro-channels 60 with this conductive ink solution, the carrier fluid evaporates, resulting in a silver micro-wire 50 in micro-channel 60. The curing process drives out the solution and sinters the metal particles to form a metallic electrical conductor. The actual final silver thickness of silver micro-wire 50 depends on the filling method and silver concentration in the conductive ink solution. Conductive inks are known in the art and are commercially available.

Conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

Electrically conductive micro-channel patterns 5 of the present invention can be employed in electronic devices to conduct electricity across the substrate 40. For example, the apparently transparent micro-wire electrode 56 formed on the substrate 40 can be electrically connected to an electronic controller (not shown) through an electrical connector (not shown) and micro-wires 50 in a touch-screen device. Signals from the electronic controller pass through conventional wires in electrical contact with micro-wires 50. Electrically conductive micro-wires 50 in micro-channel pattern 5 conduct electrical signals to and from the electronic controller to operate the touch-screen device.

The substrate 40 of the present invention can include any material capable of providing a supporting surface on which micro-channels 60 can be patterned and formed. Substrates such as glass, metal, or plastic can be used and are known in the art together with methods for providing suitable surfaces. In a useful embodiment, the substrate 40 is substantially transparent, for example having a transparency of greater than 90%, 80% 70% or 50% in the visible range of electromagnetic radiation.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin.

In various embodiments, micro-wires 50 in electrically conductive micro-channel pattern 5 are formed in the layer 42 that forms a conductive mesh of electrically connected micro-wires 50. If the substrate 40 on or in which micro-wires 50 are formed is planar, for example, a rigid planar substrate such as a glass substrate, micro-wires 50 in the layer 42 are formed in, or on, a common plane as a conductive, electrically connected mesh. If substrate 40 is flexible and curved, for example a plastic substrate, micro-wires 50 in the layer 42 are a conductive, electrically connected mesh that is a common distance from the layer surface 44 of the layer 42.

Micro-wires 50 can be formed directly on the substrate 40 or over substrate 40 on layers formed on substrate 40. The words "on", "over", or the phrase "on or over" indicate that the micro-wires 50 of the present invention can be formed directly on the layer surface 44 of layer 42, on layers formed on the substrate 40, or on either or both of opposing sides of the substrate 40. Thus, micro-wires 50 of the present invention can be formed under or beneath the substrate 40. "Over" or "under", as used in the present disclosure, are simply relative terms for layers located on or adjacent to opposing surfaces of the substrate 40. By flipping the substrate 40 and related structures over, layers that are over the substrate 40 become under the substrate 40 and layers that are under the substrate 40 become over the substrate 40.

Micro-wires 50 in the electrically conductive micro-channel pattern 5 of the present invention can form an electrode that conducts electricity better in one direction than in another direction. For example, in regions R1 and R2 the micro-wires 50 can conduct electricity with a lower resistance in direction D1.

In various embodiments of the present invention, one or more micro-channels 60 in regions R1 or R2 is connected to only two adjacent micro-channels 60 and intersects them at substantially 90 degrees, as illustrated in FIGS. 1, 5, and 6. In this case, micro-channels 60 form a rectangular grid. Alternatively, micro-channels 60 can intersect other micro-channels 60 at angles other than 90 degrees (not shown). Above-cited, commonly assigned U.S. patent application Ser. No. 13/571,704, hereby incorporated by reference in its entirety, discloses a variety of micro-channel patterns 5 including angled, straight, intersecting, and non-intersecting micro-channels 60 and micro-wires 50 that can be used in the present invention.

In other embodiments of the present invention and as shown in FIGS. 1, 5, and 6, one or more of first, second, or third micro-channels 61, 62, 63 have substantially straight line segments. Furthermore, at least some first micro-channels 61 are substantially parallel or micro-channels 62 are substantially parallel. Alternatively, one or more of first, second, or third micro-channels 61, 62, 63 is curved.

A variety of micro-channel patterns 5 can be used according to various embodiments of the present invention. Micro-channels 60 can be formed at the same or different angles to each other, can intersect each other, can be parallel, can have different lengths, or can have replicated portions or patterns. Some or all of micro-channels 60 can be curved or straight and can form line segments in a variety of patterns. Micro-channels 60 can be formed on opposing sides of the same substrate 40 or on facing sides of separate substrates 40 or some combination of those arrangements. Such embodiments are included in the present invention.

In an example and non-limiting embodiment of the present invention, each micro-channel 60 is from 5 microns wide to one micron wide and is separated from neighboring micro-channels 60 by a distance of 20 microns or less, for example 10 microns, 5 microns, 2 microns, or one micron.

Methods and device for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are all well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D1 first direction
D2 second direction
D3 third direction
D4 fourth direction
L1 first distance
L2 second distance
L3 third distance
L4 fourth distance
L5 intersection distance
R1 region 1
R2 region 2
R3 region 3
W1 width
W2 width
W3 width
W4 width
X cross section
Y cross section
5 micro-channel pattern
31 slope
32 slope
40 substrate
42 layer
44 layer surface
50 micro-wire
51 first micro-wire
52 second micro-wire
53 third micro-wire
54 fourth micro-wire
56 apparently transparent micro-wire electrode
60 micro-channel
61 first micro-channel
62 second micro-channel
63 third micro-channel
64 fourth micro-channels
71 first-direction first micro-channel
72 second-direction first micro-channel
73 first-direction second micro-channel
74 second-direction second micro-channel
75 first-direction third micro-channel
76 second-direction third micro-channel
78 micro-channel intersection
80 buss
100 touch screen and display system
110 display
111 display area
120 touch screen
122 first transparent substrate
124 transparent dielectric layer
126 second transparent substrate
128 first pad area
129 second pad area
130 first transparent electrode
132 second transparent electrode
134 wires
136 electrical buss
140 touch-screen controller
142 display controller
150 micro-wire
156 micro-pattern
200 provide substrate step
205 provide imprint master step
210 coat substrate step
215 imprint substrate with master step
220 cure coated substrate step
225 coat substrate and fill channels with ink step
230 clean substrate step
235 cure ink step

The invention claimed is:

1. A pattern of micro-channels in a layer over which ink is to be coated to form micro-wires, comprising: a substrate having the layer formed thereon, the layer including first, second, and third regions, wherein the first region is adjacent to the second region, the second region is adjacent to the third region, and the second region is between and separates the first and third regions; a plurality of connected first micro-channels formed in the first region of the layer, wherein the first region has a first density of the first micro-channels; a plurality of connected second micro-channels formed in the second region of the layer, wherein the second region has a second density of the second micro-channels; a plurality of connected third micro-channels formed in the third region of the layer, wherein the third region has a third density of the third micro-channels; wherein the first density is greater than the second density, the second density is greater than the third density; and whereby the density of the layer monotonically decreases from the first region to the second region and from the second region to the third region so that the ink coated over the layer is more effectively distributed, further including cured conductive ink in the first, second, and third micro-channels forming micro-wires; one or more micro-channels has a width of greater than or equal to 0.5 μm and less than or equal to 20 μm to provide an apparently transparent micro-wire electrode.

2. The pattern of micro-channels of claim 1, wherein each of the first, second, and third densities is a measure of the volume occupied by the first, second, and third micro-channels compared to the area of the corresponding first, second, and third regions in which the first, second, and third micro-channels are located.

3. The pattern of micro-channels of claim 1, wherein each of the first, second, and third densities is a measure of the area occupied by the first, second, and third micro-channels compared to the area of the corresponding first, second, and third regions in which the first, second, and third micro-channels are located.

4. The pattern of micro-channels of claim 1, wherein the layer is a cured layer with imprinted micro-channels.

5. The pattern of micro-channels of claim 1, wherein the first micro-channels include one or more first-direction first micro-channels connected to one or more second-direction first micro-channels, the first-direction first micro-channels extending in a first micro-channel direction and the second-direction first micro-channels extending in a second micro-channel direction different from the first micro-channel direction.

6. The pattern of micro-channels of claim 5, wherein the second micro-channels include one or more first-direction second micro-channels connected to one or more second-direction second micro-channels, the first-direction second micro-channels extending in the first micro-channel direction and the second-direction second micro-channels extending in the second direction.

7. The pattern of micro-channels of claim 6, wherein the first-direction first micro-channels are spaced apart by a first distance, the first-direction second micro-channels are spaced apart by a second distance, and the second distance is greater than the first distance.

8. The pattern of micro-channels of claim 6, wherein the first-direction first micro-channels have a first width, the first-direction second micro-channels have a second width, and the second width is greater than the first width.

9. The pattern of micro-channels of claim 6, wherein the second-direction first micro-channels have a first width, the second-direction second micro-channels have a second width, and the second width is greater than the first width.

10. The pattern of micro-channels of claim 5, wherein the third micro-channels include one or more first-direction third micro-channels connected to one or more second-direction third micro-channels, the first-direction third micro-channels extending in a third micro-channel direction different from the first micro-channel direction and the second-direction third micro-channels extending in a fourth micro-channel direction different from the second micro-channel direction.

11. The pattern of micro-channels of claim 5, wherein the third micro-channels include one or more first-direction third micro-channels connected to and intersecting with one or more second-direction third micro-channels to form micro-channel intersections spaced apart by an intersection distance that is greater than the spacing between the second-direction first micro-channels of the first region or that is greater than the spacing between the second-direction second micro-channels of the second region.

12. The pattern of micro-channels of claim 1, wherein the first region extends across the substrate in a first region direction, the second region extends across the substrate in a second region direction, and the third region extends across the substrate in a third region direction, and wherein the first region direction and second region direction are substantially parallel and the first region direction and the third region direction are not parallel.

13. The pattern of micro-channels of claim 12, wherein the first region direction and the third region direction are substantially orthogonal.

14. The pattern of micro-channels of claim 12, wherein the first micro-channels include one or more spaced-apart first-direction first micro-channels connected to one or more spaced-apart second-direction first micro-channels, the first-direction first micro-channels extending in a first micro-channel direction and the second-direction first micro-channels extending in a second micro-channel direction different from the first micro-channel direction and wherein the first micro-channel direction is substantially parallel to the first region direction.

15. The pattern of micro-channels of claim 14, further including a pattern of interconnected fourth micro-channels extending in a fourth direction.

16. The pattern of micro-channels of claim 15, wherein the fourth direction is different from the first direction.

17. The pattern of micro-channels of claim 15, wherein the pattern of interconnected fourth micro-channels has a fourth density of the fourth micro-channels equal to or greater than the first density.

18. The pattern of micro-channels of claim 1, wherein the third micro-channels include one or more first-direction third micro-channels connected to one or more second-direction third micro-channels, the first-direction third micro-channels extending in a third micro-channel direction, and the second-direction third micro-channels extending in a fourth micro-channel direction different from the third micro-channel direction.

19. The pattern of micro-channels of claim 1, wherein the first region has a side with a first width and a side with a first length greater than the first width, the second region has a side with a second width and a side with a second length greater than the second width, the third region has a side with a third width and a side with a third length greater than the third width, the third length is greater than the second length, the second region side having the second length extends along the third region side having the third width, and the first region side having the first length extends along at least the second region side having the second length.

20. The pattern of micro-channels of claim 19, wherein the second width is greater than the first width.

* * * * *